(12) United States Patent
Fukagawa et al.

(10) Patent No.: US 9,929,205 B2
(45) Date of Patent: Mar. 27, 2018

(54) IMAGING DEVICE, INSPECTION APPARATUS, AND METHOD OF MANUFACTURING ELECTRONIC DEVICE

(71) Applicant: SEIKO EPSON CORPORATION, Tokyo (JP)

(72) Inventors: Takefumi Fukagawa, Fujimi-machi (JP); Takashi Miyata, Shiojiri (JP); Satoshi Higuchi, Shiojiri (JP); Tatsuya Okamoto, Fujimi-machi (JP)

(73) Assignee: SEIKO EPSON CORPORATION, Tokyo (JP)

(*) Notice: Subject to any disclaimer, the term of this patent is extended or adjusted under 35 U.S.C. 154(b) by 200 days.

(21) Appl. No.: 14/867,736

(22) Filed: Sep. 28, 2015

(65) Prior Publication Data

US 2016/0020245 A1 Jan. 21, 2016

Related U.S. Application Data

(62) Division of application No. 13/971,044, filed on Aug. 20, 2013, now Pat. No. 9,182,273.

(30) Foreign Application Priority Data

Aug. 31, 2012 (JP) ................................. 2012-191445

(51) Int. Cl.
*H01L 27/14* (2006.01)
*H01L 27/146* (2006.01)
(Continued)

(52) U.S. Cl.
CPC ...... *H01L 27/14685* (2013.01); *G01J 1/0437* (2013.01); *G01J 1/42* (2013.01);
(Continued)

(58) Field of Classification Search
CPC ......... H01L 27/14685; H01L 27/14618; H01L 2924/0002; G01J 1/0437; G01J 1/42;
(Continued)

(56) References Cited

U.S. PATENT DOCUMENTS

| 7,038,213 B2 * | 5/2006 | Izumi .................. G02F 1/13336 |
| | | 250/370.01 |
| 9,046,969 B2 | 6/2015 | Kamaeguchi et al. |
| 2012/0127128 A1 | 5/2012 | Large et al. |

FOREIGN PATENT DOCUMENTS

| JP | H05-100186 A | 4/1993 |
| JP | 2008-164835 A | 7/2008 |
| JP | 2009-163975 A | 7/2009 |

OTHER PUBLICATIONS

Jun. 3, 2015 Office Action issued in U.S. Appl. No. 13/971,044.
Jul. 29, 2015 Office Action issued in U.S. Appl. No. 13/971,044.

* cited by examiner

*Primary Examiner* — Tony Ko
(74) *Attorney, Agent, or Firm* — Oliff PLC

(57) ABSTRACT

The imaging device includes a sensor substrate, a light-blocking substrate, a light-collecting substrate, a sealing material, and a light-transmitting member. The light-transmitting member includes a light-transmitting base disposed to be in contact with either the sensor substrate or the light-blocking substrate, and a light-transmitting resin which is filled between the base and the sensor substrate or the light-blocking substrate. A void is formed in at least a part of a space between the sealing material and the light-transmitting member.

4 Claims, 9 Drawing Sheets

(51) Int. Cl.
*G01J 1/42* (2006.01)
*G01J 1/04* (2006.01)
*G02B 3/00* (2006.01)

(52) U.S. Cl.
CPC ...... *G02B 3/0056* (2013.01); *H01L 27/14618* (2013.01); *G01J 1/0411* (2013.01); *G01J 1/4228* (2013.01); *H01L 2924/0002* (2013.01); *Y10T 156/10* (2015.01)

(58) Field of Classification Search
CPC ..... G01J 1/0411; G01J 1/4228; G02B 3/0056; Y10T 156/10
See application file for complete search history.

IMAGING DEVICE, INSPECTION APPARATUS, AND METHOD OF MANUFACTURING ELECTRONIC DEVICE

This application is a divisional application of U.S. patent application Ser. No. 13/971,044 filed Aug. 20, 2013, which claims priority to Japanese Patent Application No. 2012-191445 filed Aug. 31, 2012, the entire disclosures of which are herein incorporated by reference.

BACKGROUND

1. Technical Field

Several aspects of the present invention relates to an imaging device, an inspection apparatus loaded with the imaging device, and a method of manufacturing an electronic device.

2. Related Art

In order to improve portability and convenience of an electronic device such as a biometric authentication device or a digital camera, it is important to make an image sensor (imaging device) compact which captures a target object. For example, as described in JP-A-5-100186, there has been known an imaging device which becomes compact by interposing a pinhole (light transmitting region) between a micro-lens and a light sensing element, and arranging the micro-lens, the light sensing element, and the pinhole in a multiple way to correspond one to one each other.

In the imaging device in JP-A-5-100186, the light sensing element is disposed on an optical axis that connects the pinhole and the micro-lens, and thereby light of an inspection object (inspection light) which is collected using the micro-lens and travels along the optical axis is caused to be incident on the light sensing element.

In the imaging device, if a light blocking substrate formed with the pinhole is disposed to be inclined with respect to a sensor substrate formed with the light sensing element, the light sensing element is not disposed on the optical axis which connects the pinhole and the micro-lens, and light other than the inspection light is caused to be incident on the light sensing element. In order to inhibit such a problem, it is necessary to dispose the light blocking substrate and the sensor substrate to be opposite to each other at a uniform gap.

If the light blocking substrate is disposed to be close to the sensor substrate, for example, if the pin hole is formed right on the light sensing element, other than inspection light traveling along the optical axis, light other than the inspection light, which obliquely travels with respect to the optical axis, is also incident on the light sensing element. On the other hand, if the light blocking substrate and the sensor substrate are spaced apart from each other at an appropriate gap, light (inspection light) in the optical axis direction, which passes through the pinhole, is incident on the light sensing element, but light (light other than the inspection light) in an oblique direction with respect to the optical axis, which passes through the pinhole, is not incident on the light sensing element. Specifically, on an optical path of light (the above-mentioned light in an oblique direction with respect to the optical axis) other than the inspection light traveling to the light sensing element, a light blocking film formed on the light blocking substrate is present and light other than the inspection light is blocked by the light blocking film, and thereby the light other than the inspection light is inhibited from being incident on the light sensing element. Accordingly, in order to cause the inspection light to be selectively incident on the light sensing element, it is necessary to space (dispose) the light blocking substrate and the sensor substrate apart from each other at an appropriate gap. Specifically, if the gap between the light blocking substrate and the sensor substrate is set to an array pitch (approximately 50 μm to 100 μm) or more where the light sensing element is arranged, the inspection light is caused to be selectively incident on the light sensing element.

As described above, in the imaging device in JP-A-5-100186, if the light blocking substrate and the sensor substrate are disposed at a uniform gap of approximately 50 μm or more, light other than the inspection light which is a detection noise is not incident on the light sensing element, and it is possible to detect detection light with a high accuracy.

SUMMARY

However, for example, disposition of a pair of substrates at a uniform gap of several μm can be easily performed using a known technology such as a liquid crystal display device and the like. However, there is a problem that it is difficult to uniformly dispose the pair of substrates at a large gap of approximately 50 μm or more.

Specifically, by using the known technology, when a sealing material including a gap material of approximately 50 μm or more is formed at a peripheral portion to dispose the pair of substrates to be opposite to each other at a gap of approximately 50 μm, a region apart from a sealing material whose inner side is hollow (air layer) is easily deformed, and it is difficult to form a uniform gap throughout the substrate. Furthermore, there is also a problem that an interfacial reflection occurs at a boundary between the substrate and the air layer to attenuate the inspection light. Therefore, it is necessary to fill the inner side of the sealing material with a filler. For example, in a method where the inner side of the sealing material is filled with resin material to cure the resin material, a volume change (curing shrinkage) occurs when curing the resin material. In a large gap of approximately 50 μM or more, the content of the resin material filled in the gap is large, and the curing shrinkage of the resin material also increases. Therefore, there are problems that influence (warp of the substrate) of the curing shrinkage of the resin material increases and it is difficult to dispose the light blocking substrate and the sensor substrate to be opposite to each other using a uniform gap. Furthermore, if any one of the light blocking substrate and the sensor substrate is pressed against the other substrate by interposing the resin material between the light blocking substrate and the sensor substrate, there is a problem that the resin material filling the inside protrudes to the outside of a region surrounded by a sealing material to contaminate a terminal and the like formed at the outside of the sealing material.

As described above, there is a problem that it is difficult to uniformly dispose the light blocking substrate and the sensor substrate at a large interval of approximately 50 μm or more.

The invention can be realized in the following embodiments or application examples.

APPLICATION EXAMPLE 1

According to this application example, there is provided an imaging device, including a sensor substrate which has a sensing region where a photo-electric conversion element is disposed, a light-blocking substrate which is disposed to be opposite to a surface of a side where a sensing region of the sensor substrate is formed and a light blocking film is formed which has an opening portion at a position corresponding to a photo-electric conversion element, a light-collecting substrate which is disposed so as to interpose a light-blocking substrate in a space between the light-collecting substrate and the sensor substrate and has a micro-lens at a position corresponding to the photo-electric conversion element, a sealing material which includes a gap material forming a predetermined gap between the sensor substrate formed around the sensing region and the light-blocking substrate, and a light-transmitting member which covers the sensing region inside the sealing material and fills a space between the sensor substrate and the light-blocking substrate. The light-transmitting member includes a light-transmitting base disposed to be in contact with either the sensor substrate or the light-blocking substrate, and a light-transmitting resin which is filled in a space between the base and the sensor substrate or the light-blocking substrate. A void is formed in at least a part of space between the sealing material and the light-transmitting member.

Between the light-blocking substrate and the sensor substrate, by forming a sealing material including a gap material forming a predetermined gap around a sensing region, it is possible to form a predetermined gap on the light-blocking substrate and the sensor substrate at the periphery of the sensing region. In addition, in the sensing region surrounded using the sealing material, a light-transmitting member configured to have a light-transmitting base and a light-transmitting resin is filled. A void is formed between the sealing material and the light-transmitting member. The void is a space for storing an extra light-transmitting member, so that it is possible to inhibit the extra light-transmitting member from protruding outside a region surrounded using the sealing material. Additionally, the light-transmitting member has two-layer configuration of the base and the light-transmitting resin, so that it is possible to decrease the volume of the light-transmitting resin in the light-transmitting member compared to when the light-transmitting member is formed only using the light-transmitting resin. Accordingly, an influence of a volume change (curing shrinkage) occurring in a process forming (curing) the light-transmitting resin may be decreased. Furthermore, by processing the base to have a uniform height (thickness), it is possible to form a light-transmitting member having a uniform thickness. Accordingly, even in the sensing region, by the light-transmitting member having a uniform thickness, it is possible to uniformly dispose the light-blocking substrate and the sensor substrate using a predetermined gap.

APPLICATION EXAMPLE 2

According to this application example, there is provided an imaging device, including a sensor substrate which has a sensing region where a photo-electric conversion element is disposed, a light-blocking substrate which is disposed to be opposite to a surface of a side where a sensing region of the sensor substrate is formed and a light blocking film is formed which has an opening portion at a position corresponding to a photo-electric conversion element, a light-collecting substrate which is disposed so as to interpose a light-blocking substrate in a space between the light-collecting substrate and the sensor substrate and has a micro-lens at a position corresponding to the photo-electric conversion element, and a light-transmitting member which covers the sensing region at the inside the sealing material and fills a space between the sensor substrate and the light-blocking substrate to form a predetermined gap between the sensor substrate and the light blocking substrate. The light-transmitting member includes a light-transmitting base disposed to be in contact with either the sensor substrate or the light-blocking substrate, and a light-transmitting resin which is filled in a space between the base and the sensor substrate or the light-blocking substrate.

Between the light-blocking substrate and the sensor substrate, the light-transmitting member configured to have the light-transmitting base and the light-transmitting resin covers and fills the sensing region. The light transmitting member is configured to have two layers of the base and the light transmitting resin, and the initial base is processed to have a uniform thickness, and accordingly the shape of the base (base) is reflected on a light transmitting resin to be formed next so that the light transmitting resin may have a uniform thickness. Furthermore, compared to a case where the light transmitting member is formed only using the light transmitting resin, it is possible to reduce a volume of the light transmitting resin using the base, so that it is possible to reduce an influence of the volume change in a process of forming the light transmitting resin. Accordingly, a space between the light blocking substrate and the sensor substrate is filled with the light transmitting member with a uniform thickness, so that it is possible to uniformly dispose the light blocking substrate and the sensor substrate at a predetermined gap.

APPLICATION EXAMPLE 3

In the imaging device according to the application example, it is preferable that a predetermined gap between the sensor substrate and the light blocking substrate be 50 μm or more, and the volume occupancy of the base in the light transmitting member be 50% or more.

The sensor substrate and the light blocking substrate are spaced apart from each other at a predetermined gap (50 μm or more) to arrange a micro-lens, the opening portion, and the photo-electric conversion element on the same optical axis, and light of an inspection object (inspection light) traveling along the optical axis is caused to be incident on the photo-electric conversion element, and thereby it is possible to inhibit light other than the inspection light obliquely traveling with respect to the optical axis from being incident on the photo-electric conversion element. Accordingly, in order to selectively cause the inspection light to be incident on the photo-electric conversion element, it is preferable to uniformly dispose the sensor substrate and the light blocking substrate at a gap of 50 μm or more.

Therefore, between the sensor substrate and the light blocking substrate, it is necessary to form the light transmitting member with a thickness corresponding to the gap. In the light transmitting resin configuring the light transmitting member, the volume change (curing shrinkage) occurs in the manufacturing process. In order to form the light transmitting member at a uniform thickness, it is preferable to increase the share of the base and to decrease the share of the light transmitting resin to reduce an influence of the volume change. That is, it is preferable to set the share of the base to 50% or more in the light transmitting member to decrease the share of the light transmitting resin in the light transmitting member.

APPLICATION EXAMPLE 4

In the imaging device according to the application example, it is preferable that the base cover the sensing region to be formed on the sensor substrate.

In the sensing region of the sensor substrate, the photo-electric conversion element is changed to detect the inspection light. The photo-electric conversion element in the sensing region is covered using the base, and thereby it is possible to protect the photo-electric conversion element from a mechanical impact.

APPLICATION EXAMPLE 5

In the imaging device according to the application example, it is preferable that the light blocking substrate have the light transmitting substrate where the light blocking film is formed, and the refractive index of the light transmitting substrate be equal to the refractive index of the light transmitting member.

The detection light collected by the micro-lens sequentially passes through the opening portion of the light blocking substrate (light transmitting substrate) and the light transmitting member, and is allowed to be incident on the photo-electric conversion element of the sensor substrate. In this case, the refractive index of the opening portion (light transmitting substrate) is equal to the refractive index of the light transmitting member, and thereby it is possible to inhibit interfacial reflection in the boundary between the opening portion (light transmitting substrate) and the light transmitting member. Accordingly, it is possible to inhibit the attenuation of the inspection light by the interfacial reflection.

APPLICATION EXAMPLE 6

In the imaging device according to the application example, it is preferable that between the light blocking substrate and the light collecting substrate, the illumination substrate where the light emitting element is disposed be disposed.

Even if the illumination substrate is disposed between the light blocking substrate and the light collecting substrate, light emitted on the sensor substrate side from the illumination substrate is blocked by the light blocking substrate. Accordingly, it is possible to illuminate the inspection object without illuminating the sensor substrate. As a result, the imaging device illuminates the inspection object and detects light reflected from the inspection object, so that it is possible to stably perform inspection even at a dark place without being influenced by external light. Furthermore, the illumination substrate is disposed between the light blocking substrate and the light collecting substrate, and thereby it is possible to inhibit a volume increase of the imaging device by the addition of the illumination substrate.

APPLICATION EXAMPLE 7

According to this application example, there is provided an inspection apparatus, including the imaging device according to the application example, and a control unit performing inspection according to a result of the detection of the imaging device.

In this case, the inspection apparatus includes the imaging device described in the application example, so that the inspection apparatus may detect detection light with a high accuracy without being influenced by the external light and perform various inspections using the control unit. For example, the inspection apparatus in the present application example is mounted on a biosensor in a medical and health field such as a pulse rate monitor, a pulse oximeter, a blood glucose meter, and the like, and thereby it is possible to provide the inspection apparatus which may detect necessary information with a high accuracy. Furthermore, a finger is emitted by the imaging device of the present application example, and a vein image of the finger is captured with a high accuracy, and thereby it is possible to provide a biometric authentication device as the inspection apparatus performing personal authentication from a result of the detection. Furthermore, the inspection apparatus of the present application example may be applied to an image reading apparatus such as image scanner, copier, facsimile, and bar code reader.

APPLICATION EXAMPLE 8

According to this application example, in a method of manufacturing an electronic device having a pair of substrates disposed to be opposite to each other at a predetermined gap, there is provided a manufacturing method including: forming a base on one of the pair of substrates; coating an adhesive including a gap material forming a predetermined gap around the base; coating a light transmitting resin material on the surface of the base; disposing the pair of substrates at a predetermined gap by bringing the other substrate of the pair of substrates in contact with the light transmitting resin material to be superimposed on the one substrate; and solidifying the adhesive.

In a known method of forming the sealing material including the gap material forming a predetermined gap in a frame shape, disposing a pair of substrates at the predetermined gap by the sealing material, and filling the light transmitting resin material in a gap between the pair of substrates surrounded using the sealing material to solidify the light transmitting resin material, a volume change (curing shrinkage) increases in a process of solidifying the light transmitting resin material, so that it is difficult to dispose the pair of substrates at the predetermined gap.

In the present Application Example, since the base is formed in the gap of the pair of substrates, compared to a case where the gap of the pair of substrates is filled with only the light transmitting resin material, it is possible to decrease a filling amount (volume) of the light transmitting resin material filling in the gap of the pair of substrates. Accordingly, an influence of the volume change occurring in a solidification process of the light transmitting resin material may be reduced, so that it is possible to dispose the pair of substrates at a predetermined gap.

APPLICATION EXAMPLE 9

In the manufacturing method according to the application example, it is preferable that the volume of the light transmitting resin material coated in the coating of the light transmitting resin material, when the pair of substrates are superimposed each other at a predetermined gap, be smaller than the volume of the space surrounded by the pair of substrates, the base and the adhesive.

In a state where the space surrounded by the pair of substrates, the base, and the adhesive is filled with the light transmitting resin material, the pair of substrates is pressed to have a predetermined gap. The filling amount of the light transmitting resin material (a coating amount by coating the light transmitting resin material), when the pair of substrates are disposed at a predetermined gap, may be smaller than the volume of the space surrounded by the pair of substrates, the base, and the adhesive. Accordingly, when the pair of substrates are pressed to have a predetermined gap, it is possible to inhibit the light transmitting resin material from overflowing (run off) from the space surrounded by the pair of substrates, the base, and the adhesive.

APPLICATION EXAMPLE 10

In the manufacturing method according to the application example, it is preferable that the disposing of the pair of substrates at a predetermined gap be performed using a depressurized atmosphere.

In the disposing of the pair of substrates at a predetermined gap, the enclosed space surrounded by the pair of substrates, the base, and the adhesive is formed, and the middle of the enclosed space is filled with the light transmitting resin material. The disposing of the pair of substrates at a predetermined gap is performed using a depressurized atmosphere, and accordingly it is possible to cause the enclosed space to have a negative pressure. After forming the enclosed space, if the pressure is changed from the depressurized atmosphere to atmospheric pressure, the inside of the enclosed space has a negative pressure, and thereby a large force uniformly acts in the enclosed space based on a voltage difference between the atmospheric pressure and the negative pressure. The adhesive has a gap material forming a predetermined gap, so that a predetermined gap is uniformly formed on the pair of substrates by uniformly pressing the pair of substrate. Furthermore, the light transmitting resin material is exposed to the depressurized atmosphere, and thereby the light transmitting resin material is deformed and air bubbles are inhibited from being mixed therein.

APPLICATION EXAMPLE 11

In the manufacturing method according to the application example, it is preferable that the adhesive be a photo-curable resin, and the light transmitting resin material be a thermo-curable resin.

The adhesive is formed in a region having a property of light transmission at a peripheral edge portion of the pair of substrates. The adhesive is caused to be the photo-curable resin, and thereby, without receiving an influence of heat (heat deformation), it is possible to quickly form a predetermined shape. On the other hand, the light transmitting resin fills the gap between the pair of substrates where various light blocking patterns are formed, so that it is difficult to completely light-solidify the light transmitting resin by emitting light onto the entire surface thereof. Therefore, the light transmitting resin material is preferably the thermo-curable resin, and it is possible to entirely solidify the light transmitting resin material by performing a heat treatment. Furthermore, when performing thermo-curing on the light transmitting resin material, the pair of substrates is solidified using the light-cured adhesive, and thereby it is possible to inhibit the pair of substrates from being deformed by the heat treatment and to dispose the pair of substrates in the predetermined gap.

APPLICATION EXAMPLE 12

In the manufacturing method according to the application example, it is preferable that the predetermined gap of the pair of substrates be 50 μM or more, and in a total volume which is a sum of the volume of the base disposed between the pair of substrates and the volume of the light transmitting resin material, the base be formed so as to have a 50% or more volume occupancy.

In order to selectively detect inspection light, it is preferable to dispose the sensor substrate and the light blocking substrate at a gap of 50 μm or more. Furthermore, the light transmitting resin disposed between the sensor substrate and the light blocking substrate is a member which has a volume change (curing shrinkage) in the manufacturing process, so that, in order to form the light transmitting member with a uniform thickness, it is preferable to increase the share of the base and to decrease the share of the light transmitting resin in the light transmitting member. That is, in the base and the light transmitting resin material disposed in the gap of the pair of substrates and the light transmitting resin material, it is preferable that the volume occupancy of the base, which is the total volume provided by adding the volume of the base and the volume of the light transmitting material, be caused to be 50% or more, and the volume of the light transmitting resin material be smaller than the volume of the base.

APPLICATION EXAMPLE 13

According to this application example, there is provided a method of manufacturing an electronic device having the pair of substrates disposed to be opposite to each other at a predetermined gap. The method includes forming a base on one substrate of the pair of substrates, coating a light-transmitting resin material on the surface of the base, disposing the pair of substrates at a predetermined gap by bringing the other substrate of the pair of substrates into contact with the light transmitting resin material to be superimposed on the one substrate, and solidifying the light transmitting resin material.

First, the base which has a smooth surface and a uniform thickness is formed on one of the pair of substrates. Next, if the surface of the base is coated with the light transmitting resin material to be superimposed on the other substrate of the pair of substrates, the surface shape of the base (base) is reflected in the light transmitting resin material, and the light transmitting resin material has a smooth surface and a uniform thickness the same as the base. Accordingly, both the base and the light transmitting resin material have a uniform thickness, and thereby it is possible to uniformly form the gap between the pair of substrates by disposing the base and the light transmitting resin material in the gap between the pair of substrates.

APPLICATION EXAMPLE 14

In the manufacturing method according to the application example, it is preferable that the light transmitting resin material be a thermo-curable resin.

The pair of substrates has a light blocking pattern, so that it is difficult to emit light to an entire surface of the light transmitting resin material, and if a photo-curable resin is used for the light transmitting resin material, it is difficult to be completely solidified. Thus, the light transmitting resin material is preferably a thermo-curable resin, and it is possible to completely solidify the light transmitting resin material interposed between the pair of substrates by performing a heat treatment.

APPLICATION EXAMPLE 15

In the manufacturing method according to the application example, it is preferable that the predetermined gap be 50 μm or more, and the base be formed so as to make a thickness be 90% or more of the predetermined gap.

In order to selectively detect inspection light, it is preferable to dispose the sensor substrate and the light blocking substrate at a gap of 50 μm or more. Furthermore, the light transmitting resin member disposed between the sensor substrate and the light blocking substrate has a volume change (curing shrinkage) in the manufacturing process. On the other hand, the base is processed to have a uniform thickness using a resin. Thus, in order to form the light transmitting member in a uniform thickness, it is preferable to increase the share of the base as much as possible and to decrease the share of the light transmitting resin material as much as possible in the light transmitting member. Specifically, it is preferable to set the share of the base to 90% or more and the light transmitting resin material to less than 10%, and to reduce an influence of the volume change of the light transmitting resin material.

APPLICATION EXAMPLE 16

In the manufacturing method according to the application example, it is preferable that the base be formed using the photo-curable resin.

If the base is coated with the photo-curable resin and left as it is for a constant time, the photo-curable resin flows so that the surface area may be reduced using the surface tension and the weight of the photo-curable resin. Specifically, the photo-curable resin in a state that concave and convex are large immediately after coating (the surface area is large) flows in a direction to reduce the surface area, that is, in a direction to be a smooth surface. Furthermore, the photo-curable resin does not receive the influence of heat (heat deformation) in a curing process. That is, by emitting ultraviolet rays, it is possible to inhibit the influence of heat (heat deformation) and to solidify the photo-curable resin having a smooth surface. Accordingly, using the photo-curable resin, it is possible to form the base having a smooth surface and a uniform thickness.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following, with reference to the drawings, describes embodiments of the present invention. Such embodiments illustrate an aspect of the present invention, and without limiting the present invention, can be arbitrarily changed within a scope of technical concepts of the present invention. In addition, in following drawings, in order to set each layer and each part to a size which may be recognized on the drawings, each layer and each part are made differently from the actual scales.

First Embodiment

Figure 1:
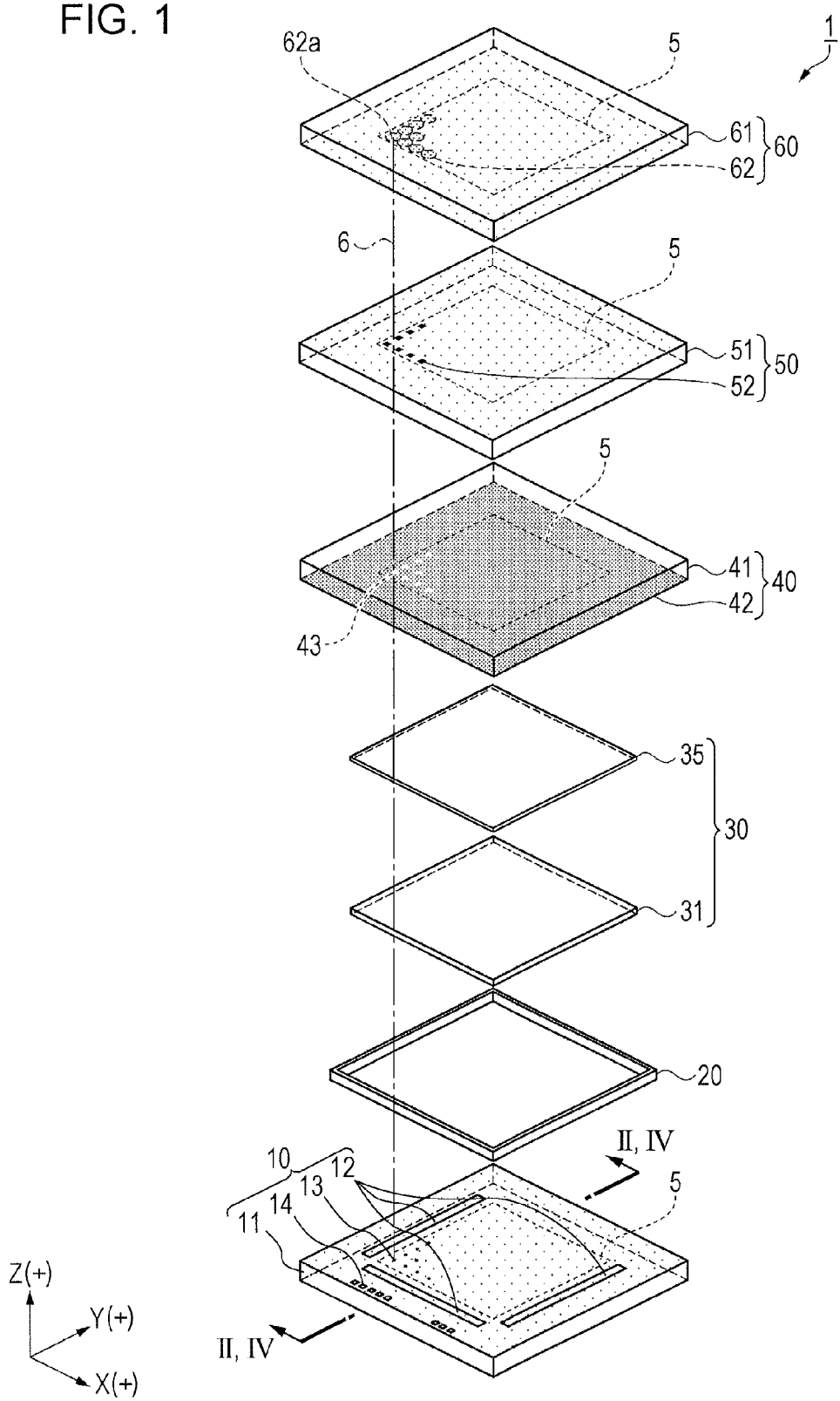
FIG. 1 is an exploded perspective view of an imaging device according to a first embodiment.
Figure 2:
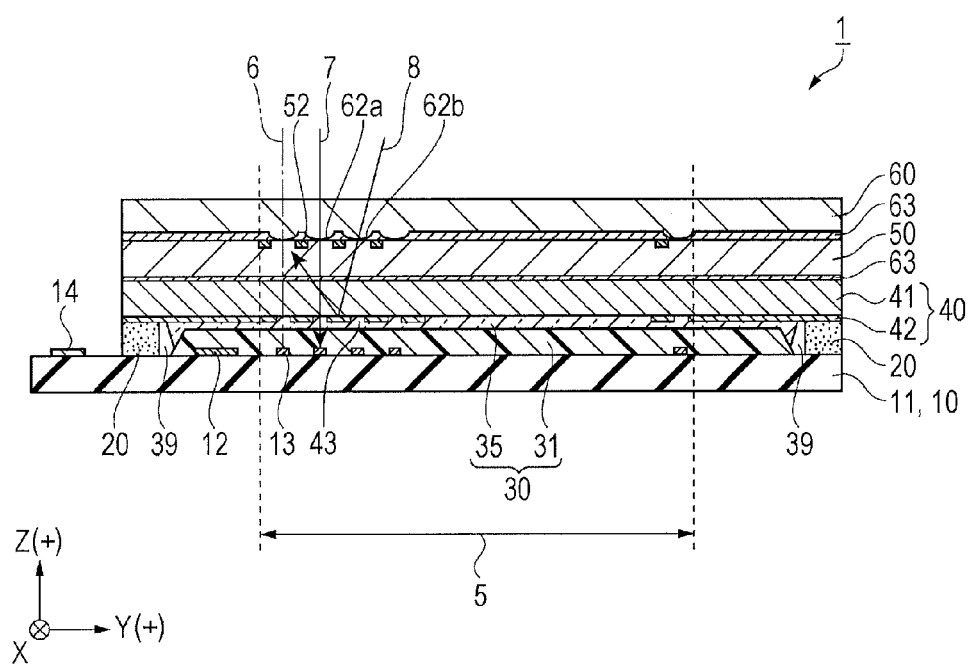
FIG. 2 is a cross-sectional view of the imaging device taken along a line II-II of FIG. 1.

FIG. 1 is an exploded perspective view of an imaging device according to a first embodiment. FIG. 2 is a cross-sectional view of the imaging device taken along a line II-II of FIG. 1. First, referring to FIGS. 1 and 2, a schematic configuration of an imaging device 1 according to the embodiment is described.

Overview of Imaging Device

The imaging device 1 according to the embodiment is an image sensor emitting light to an emitted body (not illustrated) to convert light reflected from the emitted body into an electric signal. The imaging device 1 includes a light-emitting element 52 emitting the emitted body and a sensing region 5 where a photodiode 13 and the like as a photoelectric conversion element detecting light (inspection light) of an inspection object reflected from the emitted body is disposed. The shape of the sensing region 5 is a square shape, and is illustrated by dashed lines in FIGS. 1 and 2.

Hereinafter, a direction along one side of the sensing region 5 close to a terminal 14 is set to a X axis direction, a direction along other two sides which are orthogonal to the one side and opposite to each other is set to a Y axis direction, and a width direction of the imaging device 1, which is orthogonal to the X axis direction and the Y axis direction, is set to a Z axis direction.

As illustrated in FIGS. 1 and 2, in the imaging device 1, a sensor substrate 10, a member (a sealing material 20, a light transmitting material 30) which forms a predetermined gap between the sensor substrate 10 and a light blocking substrate 40, the light blocking substrate 40, an illumination substrate 50, and a micro-lens array (hereinafter, referred to as MLA) substrate 60 are stacked in the Z axis (+) direction in this order. In addition, the light blocking substrate 40 and the illumination substrate 50, and the illumination substrate 50 and the MLA substrate 60 adhere to each other, respectively, using a transparent adhesive 63 (FIG. 2).

The sensor substrate 10 has a role of converting a reflected light from the emitted body into an electrical signal. The sensor substrate 10 includes a sensor substrate main body 11, a photodiode 13 formed on a surface of a Z axis (+) direction side of the sensor substrate main body 11, a circuit unit 12, and a terminal 14 and the like. The sensor substrate main body 11 may be an insulation substrate, and may be made using glass, quartz, resin, ceramic, and the like. The photodiode 13, for example, is configured to include a photoelectric conversion element having a PIN type semiconductor layer as a photo-electric conversion layer, and thereby it is possible to detect light of a near infrared region. In the sensing region 5, the photodiode 13 is arranged at equal gaps in the X direction and the Y direction, and the gap (array pitch) is approximately 100 μm. The circuit unit 12, for example, is configured to include a complementary type transistor which has a n channel type transistor and a P channel type transistor. The terminal 14 is connected to an external circuit (not illustrated), and supplies a control signal from the external circuit to the circuit unit 12.

The sealing material 20 includes a gap material (not illustrated) forming a predetermined gap (approximately 100 μm) between the sensor substrate 10 and the light blocking substrate 40, and is disposed around the sensing region 5 in a frame shape. Using the sealing material 20 in the frame shape, the sensor substrate 10 and the light blocking substrate 40 are disposed at a gap of approximately 100 μm.

The light transmitting member 30 is configured to include a base 31 and a light transmitting resin 35, and is disposed over the sensing region 5 between the sensor substrate 10 and the light blocking substrate 40. The base 31 is disposed on the sensor substrate 10 side and a thickness of the base 31 (length of the Z axis direction) is approximately 70 μm. The base 31 has a role of protecting the photodiode 13 disposed in the sensing region 5 of the sensor substrate 10 from a mechanical shock. The light transmitting resin 35 is disposed on the light blocking substrate 40 side (between the base 31 and the light blocking substrate 40), and a thickness of the light transmitting resin 35 is approximately 30 μm. Accordingly, in the sensing region 5 between the sensor substrate 10 and the light blocking substrate 40, the light transmitting member 30 with a thickness of 100 μm is disposed (filled), so that it is possible to dispose the sensor substrate 10 and the light blocking substrate 40 at a uniform gap (approximately 100 μm) in the sensing region 5.

Furthermore, between the sealing material 20 and the light transmitting member 30, a void 39 (refer to FIG. 2) is formed. The void 39 is a storage space for storing the light transmitting resin 35 overflowing from the base 31 in a manufacturing process to be described below, and has a role of inhibiting the light transmitting resin 35 from protruding to the outside of the sealing material 20.

A configuration may be provided in which the base 31 is disposed on the light blocking substrate 40 side and the light transmitting resin 35 is disposed on the sensor substrate 10 side.

The light blocking substrate 40 is configured to include a light blocking substrate main body 41 and a light blocking film 42 disposed on a surface of Z axis (−) direction side of the light blocking substrate main body 41. The light blocking substrate main body 41 is a light transmitting substrate, for which glass, quartz, resin, and the like may be used. The light blocking film 42 may be a film having a property of light transmission, for which a metal film, for example, Cr and the like, may be used. In the light blocking film 42, an opening portion 43 is formed at a position corresponding to the photodiode 13, and inspection light reflected from the emitted body passes through the opening portion 43 to be incident on the photodiode 13.

As described above, the light transmitting member 30 is disposed between the sensor substrate 10 and the light blocking substrate 40, and inspection light passing through the opening portion 43 is caused to pass through the light transmitting member 30 to be incident on the photodiode 13. The refractive index of the light transmitting member 30 is substantially equal to the refractive index of the light blocking substrate main body 41. Therefore, interfacial reflection at a boundary between the light blocking substrate main body 41 and the light transmitting member 30 is inhibited in the opening portion 43, and thereby it is possible to inhibit attenuation of the inspection light.

The illumination substrate 50 includes an illumination substrate main body 51, a light-emitting element 52 formed on a surface of a Z axis (+) direction side of the illumination substrate main body 51, and the like. The light-emitting element 52 is an organic electroluminescence element which emits light of the near-infrared region in the Z axis (+) direction, and is configured to have an anode (not illustrated), a light-emitting functioning layer (not illustrated), and a cathode (not illustrated). In addition, the light-emitting element 52 is arranged in a matrix in the sensing region 5 to uniformly emit the emitted body.

A MLA substrate 60 is an example of "light collecting substrate", and has a role of collecting light of an inspection object reflected from the emitted body and leading the light to the photodiode 13. The MLA substrate 60 is configured to include a MLA substrate main body 61, a micro-lens 62 formed on a surface of the Z axis (−) direction side of the MLA substrate main body 61, and the like. The MLA substrate main body 61 is a light transmitting substrate, for which glass, quartz, resin, and the like may be used. The micro-lens 62 is a spherical lens formed by a transparent resin or glass or a non-spherical lens, and is disposed in a matrix shape in the sensing region 5. The micro-lens 62 may be formed using a reflow method, the halftone mask method, a micro-lens method, a molding process method, and the like.

Outline of Sensing Region

Next, outline of the sensing region 5 (a detection method of inspection light and the like) will be described.

In the sensing region 5, the photodiode 13, the opening portion 43, the light-emitting element 52, the micro-lens 62, and the like are arranged in a matrix shape so as to be one to one corresponding to each other, respectively. An optical axis 6 illustrated with a dashed line in FIGS. 1 and 2 is a virtual line connecting the center of one micro-lens 62a out of a plurality of arranged micro-lenses with the center of the opening portion 43 and is parallel to the Z axis direction. In FIG. 2, an arrow sign with a numeral no. 7 indicates inspection light (hereinafter, referred to as inspection light 7) which is incident on a photodiode 13 out of the plurality of arranged photodiodes. The photodiode 13 corresponds to the micro-lens 62a. An arrow sign with a numeral number 8 indicates light traveling on an optical path connecting an adjacent micro-lens 62b and the photodiode 13, that is, light in addition to inspection light 7 traveling from the adjacent micro-lens 62b to the photodiode 13 (hereinafter, referred to as redundant light 8).

The micro-lens 62a, an opening portion 43, and the photodiode 13 are disposed on the optical axis 6, and the light-emitting element 52 is disposed at a position spaced apart from the optical axis 6. As a result, inspection light 7 collecting light using the micro-lens 62a is not blocked by the light-emitting element 52. Additionally, a region intersecting with the optical axis 6 of the illumination substrate 50 (a region through which the inspection light 7 passes) has a property of light transmission, and the inspection light 7 is allowed to pass through (go through) the illumination substrate 50.

As illustrated in FIG. 2, light which is collected using the micro-lens 62a and travels along the optical axis 6 is set to inspection light 7. That is, the inspection light 7 passes through the micro-lens 62a of the MLA substrate 60, a light transmitting region of the illumination substrate 50, the opening portion 43 of the light blocking substrate 40, and the light transmitting member 30 to be incident on the photodiode 13 of the sensor substrate 10. In other words, light which is incident on the micro-lens 62a from the above of the micro-lens 62a (Z axis direction) travels along the optical axis 6 to be incident on the photodiode 13. That is, in the sensing region 5, it is possible to image the image information of the object to be incident on the micro-lens 62a from the Z axis direction.

The micro-lens 62a is a so-called convex lens, and light collected using the micro-lens 62a (image information of an object) is adapted to form an image on a light sensing surface of the photodiode 13. Furthermore, the light blocking substrate 40 is disposed approximately 100 µm apart from the sensor substrate 10 using the light transmitting member 30. A gap between the light blocking substrate 40 and the sensor substrate 10 is equal to an array pitch of the photodiode 13 (approximately 100 µm) which is arranged in the sensing region 5 of the sensor substrate 10. In a state where the sensor substrate 10 and the light blocking substrate 40 are disposed to be opposite to each other at a gap of approximately 100 µm, an opening size of the opening portion 43 is made to the smallest size that the inspection light 7 collected using the micro-lens 62a may pass through the opening portion 43. As a result, the light 8 not necessary to be entered from the adjacent micro-lens 62b is reflected (light blocked) by the light blocking film 42 of the light blocking substrate 40, and is inhibited from being incident on the photodiode 13. In addition to the redundant light 8, there are lights besides the inspection light 7. These lights besides the inspection light 7 are all lights traveling in an oblique direction with respect to the optical axis 6, and are blocked by the light blocking film 42 of the light blocking substrate 40 to be inhibited from being incident on the photodiode 13. Light besides the inspection light 7 is a detection noise of the photodiode 13, so that it is possible to image the image information with less detection noise and high accuracy using the photodiode 13 by blocking the light besides the inspection light 7.

Accordingly, in order to block the redundant light 8 and allow the inspection light 7 to be selectively incident on the photodiode 13, it is important to dispose the light blocking substrate 40 and the sensor substrate 10 in parallel at a gap of an array pitch of the photodiode 13 or more.

Due to the bending and the like of the substrate, if there occurs a region where the light blocking substrate 40 is obliquely disposed with respect to the sensor substrate 10, in the region, there is an error that the photodiode 13 is not disposed on the optical axis 6 and the inspection light 7 is not incident. In order to avoid the above-mentioned error, it is preferable to form a gap between the light blocking substrate 40 and the sensor substrate 10 with an accuracy of ±5% or less.

In the embodiment, the array pitch of the photodiode 13 is approximately 100 µm, and the light blocking substrate 40 and the sensor substrate 10 are disposed in parallel at a uniform gap of approximately 100 µm. The present invention has an appropriate manufacturing method to dispose the light blocking substrate 40 and the sensor substrate 10 at a uniform gap, and therefore an outline thereof will be described below.

Figure 3:
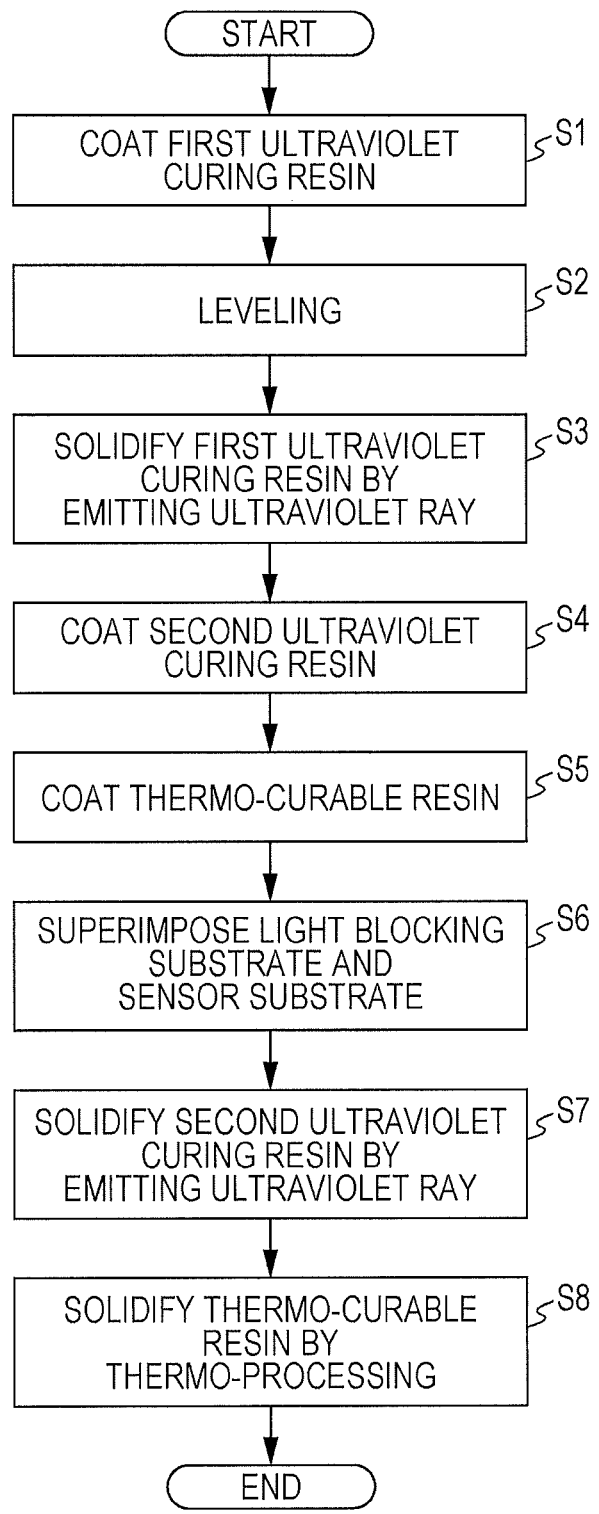
FIG. 3 is a flowchart illustrating a method of manufacturing the imaging device according to the first embodiment in a process order.
Figure 4:
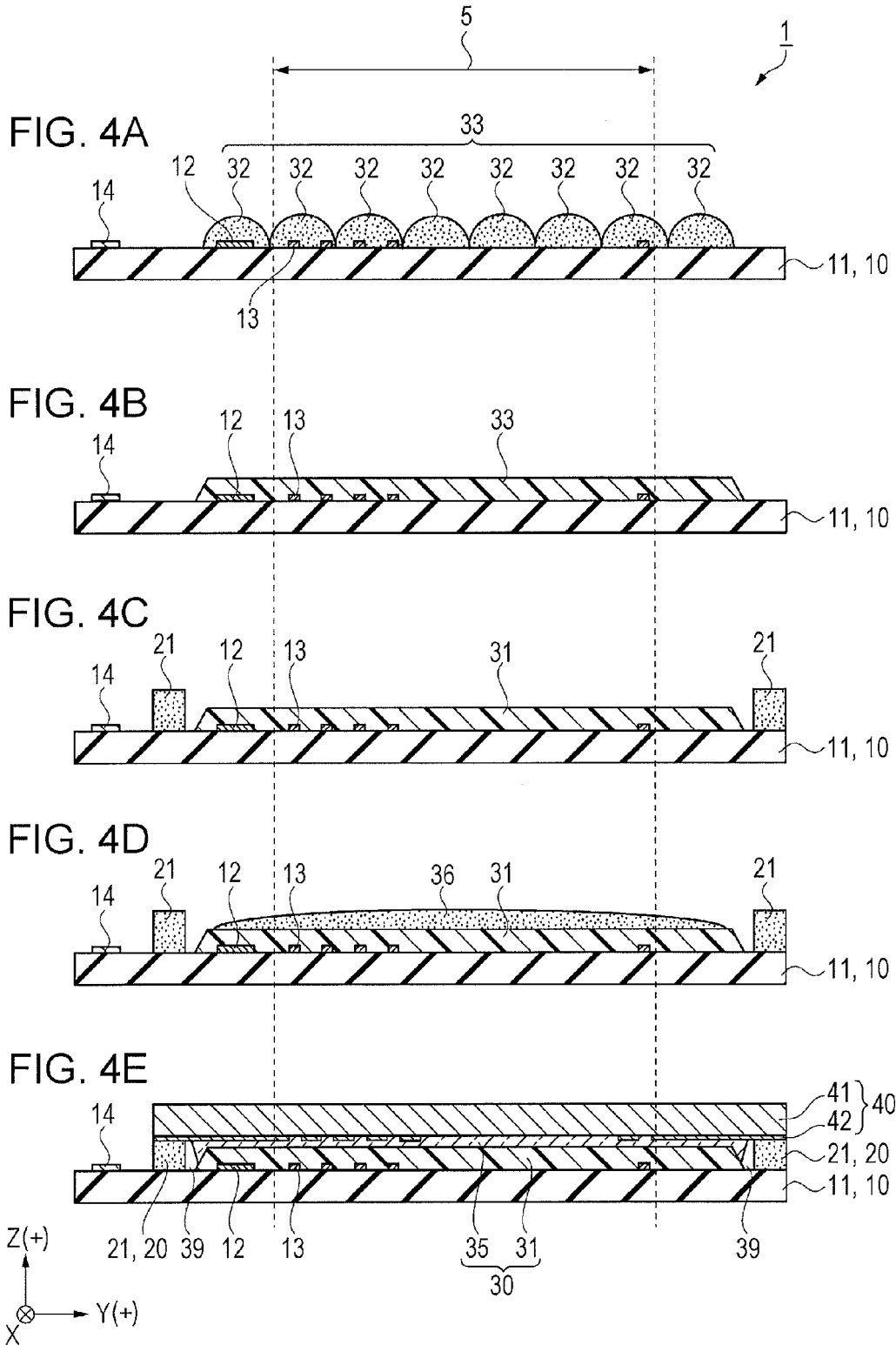
FIGS. 4A to 4E are cross-sectional views of a main process taken along a line IV-IV of FIG. 1.

Outline of a Manufacturing Method of Disposing Light Blocking Substrate and Sensor Substrate at a Uniform Gap FIG. 3 is a flowchart illustrating a manufacturing method of disposing the light blocking substrate and the sensor substrate at a uniform gap in a process order. FIG. 4A to 4E are cross-sectional views of a main process taken along a line of IV-IV of FIG. 1. In FIG. 4, the sensing region 5 is illustrated by dashed lines so that a position of a component configured using each process may be known. Hereinafter, the outline of a manufacturing method according to the present embodiment will be described referring to FIGS. 3 and 4.

In a process of step S1 (FIG. 3), by coating a first ultraviolet (hereinafter, referred to as UV) curable resin 32 on the sensor substrate 10 using a dispenser, a base precursor 33 is formed. The first UV curable resin 32 is an example of "photo-curable resin", and is configured to have a UV curable epoxy resin with a viscosity of approximately 500 cP (mPa·s). The first UV curable resin 32 covers the sensing region 5 and is coated to the periphery of the sensing region 5 to form the base precursor 33.

FIG. 4A illustrates a state of right after coating of the first UV curable resin 32. As illustrated in FIG. 4A, in right after coating of the first UV curable resin 32, the first UV curable resin 32 coated and formed in a line along a X axis direction is arranged in a multiple way in a Y axis direction to form the base precursor 33. Therefore, the base precursor 33 (a surface on the Z axis (+) direction side) has concave-convex surface, and a thickness (length in the Z axis direction) of the surface is periodically changed.

In a process of step S2 (FIG. 3), the coated first UV curable resin 32 is left as it is for a certain time and allowed to flow the first UV curable resin 32 to perform leveling for making the thickness of the base precursor 33 uniformly. The thickness of the base precursor 33 depends on an amount of coating of the first UV curable resin 32. In a process of curing the first UV curable resin to be described below, the first UV curable resin is contracted in volume. Considering the volume contraction, the base precursor 33 is coated and formed so as to be thicker than the thickness of the base 31 (approximately 70 µm). Specifically, the thickness of the base precursor 33 is approximately 74 µm.

FIG. 4B illustrates a state of the base precursor 33 after being leveled. In a process of step S2, in order to minimize the area of the surface of the base precursor 33 according to the surface tension and the weight of the first UV curable resin 32, the first UV curable resin 32 flows. Therefore, the concave and convex on the surface of the base precursor 33 are reduced so that the base precursor 33 may be configured to have a smooth (flat) surface. Then, the base precursor 33 has a uniform thickness after leveling.

In a process of step S3 (FIG. 3), UV light is emitted to the base precursor 33 and the first UV curable resin 32 is cured (solidifying) to form the base 31. As a result, the base precursor 33 in a shape illustrated in FIG. 4B is the base 31. As illustrated in FIG. 4B, the base 31 has a cross-section in a shape of trapezoidal where an edge of a side in contact with the sensor substrate 10 is caused to be long. In addition, the end portions of the base 31 are in a tapered shape, which are inclined with respect to the Z axis (+) direction. The base precursor 33 is contracted in volume when cured by the UV light and the thickness of the base 31 is caused to be approximately 70 µm.

A resin material forming the base precursor 33 may be either a thermo-curable resin or a resin having thermo-curability and photo-curability. Even in a case of using these resins, the same leveling process is performed, and these resins are allowed to flow so as to minimize the area of the surface according to the surface tension and the weight of the resin, and thereby it is possible to form the based precursor 33 having a smooth (flat) surface. Even in a case of using either the thermo-curable resin or the resin having thermo-curability and photo-curability, the same volume contraction occurs when the resin is cured. Accordingly, it is necessary to form the base precursor 33 in anticipation of the volume contraction so that the thickness of the base 31 may be a predetermined size (approximately 70 µm).

In a process of step S4 (FIG. 3), a second UV curable resin 21 is coated to the periphery of the sensing region 5 on the sensor substrate 10 using a dispenser so as to surround the base 31. The second UV curable resin 21 includes a gap material of 100 µm (not illustrated), and is an example of "adhesive including a gap material having a predetermined gap". Specifically, the second UV curable resin 21 is configured to have a UV curable epoxy resin with high viscosity of approximately 600,000 cP. The thickness of the second UV curable resin 21 (length in the Z axis direction) is approximately 140 μm, and is pressed and solidified in a process described below to be the sealing material 20 having a thickness of approximately 100 μm.

FIG. 4C is a view illustrating a state after coating the second UV curable resin 21. As illustrated in FIG. 4C, the second UV curable resin 21 is formed in a frame shape to enclose the sensing region 5. The second UV curable resin 21 is a resin with high viscosity (approximately 600,000 cp). Even if the second UV curable resin is formed with a thickness of 140 μm using the gap material dispersed therein, it is possible to inhibit a change in shape (a change in thickness).

In a process of step S5 (FIG. 3), using the dispenser, the thermo-curable resin 36 is coated on the surface of the base 31 (a side surface of the light blocking substrate 40). The thermo-curable resin 36 is an example of "light transmitting resin material". In addition, the viscosity of the thermo-curable resin 36 is approximately 300 cP.

FIG. 4D is a view illustrating a state after coating the thermo-curable resin 36. The thermo-curable resin 36 has a low viscosity (approximately 300 cP), so that the thermo-curable resin may flow (spread) on the surface of the base 31 using the surface tension and the weight of the thermo-curable resin 36. As a result, as illustrated in FIG. 4D, the thermo-curable resin 36 is formed to cover the surface of the base 31. A coating amount (dropping amount) of the thermo-curable resin 36 will be described.

In a process of step S6 (FIG. 3), the light blocking substrate 40 and the sensor substrate 10 are superimposed (bonded) on a predetermined position. The superimposing process is performed with the pressure of external atmosphere decreased (depressurized atmosphere), and the light blocking substrate 40 and the sensor substrate are superimposed at a predetermined position while being pressed. In a process of step S6, an enclosed space surrounded by the sensor substrate 10, the light blocking substrate 40, and the second UV curable resin 21 is formed. In addition, the enclosed space is filled with the thermo-curable resin 36.

In a process of step S7 (FIG. 3), UV light is emitted by changing external atmosphere from the depressurized state to the atmospheric pressure and the second UV curable resin 21 is cured (solidified) to form the sealing material 20. The enclosed space formed by the depressurized atmosphere of step S6 (a space filled with the thermo-curable resin 36) has a negative pressure compared to atmospheric pressure, so that if external atmosphere is changed from a depressurized state to atmospheric pressure, a large pressure equivalent to a pressure difference between a pressure of the depressurized atmosphere (negative pressure) and atmospheric pressure uniformly acts in the enclosed space. That is, if the external atmosphere is changed from the depressurized state to the atmospheric pressure, a large force to be described uniformly acts between the light blocking 40 and the sensor substrate 10, and the second UV curable resin 21 is compressed to the thickness of the gap material (approximately 100 μm). The compressed second UV curable resin 21 is solidified by UV light to form the sealing material 20 forming a predetermined gap (approximately 100 μm) between the sensor substrate 10 and the light blocking substrate 40.

FIG. 4E is a view illustrating a state after changing the external atmosphere to the atmospheric pressure in a process of step S7. As described above, a large force uniformly acts between a surface on the Z axis direction side of the light blocking substrate 40 and a surface on the Z axis direction side of the sensor substrate 10, and a gap between the light blocking substrate 40 and the sensor substrate 10 is changed from approximately 140 μm to approximately 100 μm. At this time, a gap between the surface of the base 31 and the light blocking substrate 40 is changed from approximately 70 μm to approximately 30 μm, and the thermo-curable resin 36 filled between the surface of the base 31 and the light blocking substrate 40 protrudes to the periphery of the base 31. The thermo-curable resin 36 overflowing from the surface of the base 31 stays at the void 39 between the sealing material 20 (the second UV curable resin 21) and the base 31, and in order not to protrude out of the sealing material 20 (the second UV curable resin 21), a coating amount of the thermo-curable resin 36 is set in the step S5.

Specifically, the coating amount of the thermo-curable resin 36 in the process of step 5, when the sensor substrate 10 and the light blocking substrate 40 are disposed in a predetermined gap (approximately 100 μm) in a process of step S7, is set to be smaller than the volume of a space surrounded by the sensor substrate 10, the light blocking substrate 40, the sealing material 20, and the base 31. As a result, the thermo-curable resin 36 overflowing from the surface of the base 31 stays at the void 39 between the sealing material 20 and the base 31 not to protrude out of the sealing material 20.

If the thermo-curable resin 36 protrudes out of the sealing material 20, there is a possibility that the terminal 14 is contaminated and an electrical connection between an external circuit (not illustrated) and the terminal 14 is inhibited. As described above, in a process of step S5, the coating amount of the thermo-curable resin 36 is set to an amount that the thermo-curable resin 36 does not protrude out of the sealing material 20, and thereby it is possible to inhibit the terminal 14 from being contaminated. Furthermore, the void 39 formed between the sealing material 20 and the base 31 has a role of storage for storing the thermo-curable resin 36 overflowing from the surface of the base 31 in the process of step S7, and the void 39 is an important component for the thermo-curable resin 36 not to protrude out of the sealing material 20. That is, in order to form the void 39, in the process of step S4, it is preferable to coat the second UV curable resin 21 which is a precursor of the sealing material 20 apart 0.3 mm to 1 mm from the base 31.

In a process of step S8 (FIG. 3), a heat treatment is performed, the thermo-curable resin 36 is cured (solidified), the light transmitting resin 35 with a thickness of approximately 30 μm is formed between the base 31 and the light blocking substrate 40. The refractive index of the light transmitting resin 35 and the refractive index of the base 31 are substantially equal to the refractive index of the light blocking substrate main body 41. Accordingly, at the boundary (interface) between the light blocking substrate main body 41 and the light transmitting resin 35, and the boundary between the light transmitting resin 35 and the base 31, it is possible to inhibit interfacial reflection based on the difference in a refractive index. Furthermore, the thermo-curable resin 36 is coated using a depressurized atmosphere, so that it is possible to inhibit an air bubble from being mixed into the thermo-curable resin 36, that is, to inhibit an air bubble from being mixed into the light transmitting resin 35. If the air bubble is inhibited from being mixed into the light transmitting resin 35, it is possible to inhibit the interfacial reflection at the boundary between the air bubble and the light transmitting resin 35 based on the difference in a refractive index.

In addition, refractive index of a transparent adhesive 63, refractive index of a MLA substrate main body 61, refractive index of the illumination substrate main body 51, and refractive index of the light blocking substrate main body 41 disposed at a gap between the MLA substrate 60 and the illumination substrate 50, and a gap between the illumination substrate 50 and the light blocking substrate 40 are equal to each other, so that the same interfacial reflection is inhibited. In addition, in the transparent adhesive 63, the first UV curable resin 32, the second UV curable resin 21, and the thermo-curable resin 36, a defoamation process is performed in the depressurized atmosphere, so that the mixture of the air bubble is inhibited.

In the present invention, the sealing material 20 forming a predetermined gap after forming the base 31 is formed to decrease a filling amount of the thermo-curable resin 36 filling between the light blocking substrate 40 (base 31) and the sensor substrate 10. Accordingly, it is possible to reduce volume contraction of the thermo-curable resin 36, which occurs when the thermo-curable resin 36 is cured in a process of step S8. As a result, an influence caused by the volume contraction (warp of substrate) is reduced, and even if the light blocking substrate 40 and the sensor substrate 10 are disposed at a big gap of approximately 100 µm, the warp of the light blocking substrate 40 or the sensor substrate 10 are reduced. Accordingly, it is possible to dispose the light blocking substrate 40 and the sensor substrate 10 at a uniform gap. Furthermore, at the periphery of the thermo-curable resin 36, the void 39 is formed, and thereby the influence of the volume shrinkage occurring in a solidification process of the thermo-curable resin 36 is eased also by the void 39.

Accordingly, in order to dispose the light blocking substrate 40 and the sensor substrate 10 at a uniform gap, in a space surrounded by the sensor substrate 10, the light blocking substrate 40, and the sealing material 20, it is important to initially form the base 31 to decrease the filling amount of the thermo-curable resin 36 filling in the space.

In a process of step S3 (FIG. 3) of forming the base 31, the volume contraction of the first UV curable resin 32 forming the base 31 occurs. However, the base 31 is formed before the process of step S6 of forming a predetermined gap, so that the volume contraction does not influence the predetermined gap.

Furthermore, in a volume of a space surrounded by the sensor substrate 10, the light blocking substrate 40, and the sealing material 20, that is, a volume of a space where the light transmitting member 30 is disposed, the base 31 is formed so that the volume occupancy of the base 31 may be 50% or more, the thermo-curable resin 36 is filled so that the volume occupancy of the thermo-curable resin 36 may be less than 50% to decrease the filling amount of the thermo-curable resin 36. Accordingly, influence of the volume contraction occurring in the solidification process of the thermo-curable resin 36 are reduced, and it is possible to dispose the light blocking substrate 40 and the sensor substrate 10 at a predetermined gap (approximately 100 µm).

As the volume occupancy of the thermo-curable resin 36 becomes smaller, the volume contraction becomes smaller in the solidification process of the thermo-curable resin 36. It is possible to dispose the sensor substrate 10 and the light blocking substrate 40 at a more uniform gap, and thereby it is preferable that the volume occupancy of the base 31 be larger and the volume occupancy of the thermo-curable resin 36 be smaller.

In addition, it is also possible to form the base 31 with a thickness of 100 µm or more. However, using liquid of the first UV curable resin 32 and the like which forms the base precursor 33, it is difficult to make the base 32 in a predetermined form as the thickness (film thickness) of the base 31 becomes larger. Based on (In consideration of) manufacturing condition of the base 31, the thickness of the base 31 is preferred to be 100 µm or less.

As described above, according to the imaging device 1 related to the present embodiment, the following effects can be obtained.

(1) The light blocking substrate 40 and the sensor substrate 10 are disposed at a predetermined gap (approximately 100 µm) which is suitable for the inspection light 7 to be selectively incident on the photodiode 13, and thereby it is possible to inhibit light in addition to the inspection light 7 which is a detection noise. Accordingly, it is possible to provide the imaging device 1 where detection may be performed with a high accuracy and less noise components.

(2) In a space surrounded by the sensor substrate 10, the light blocking substrate 40, and the sealing material 20, the base 31 is formed, and the filling amount of the thermo-curable region 36 filled in the space becomes smaller, so that influence of the volume contraction (warp of the substrate) occurring in a solidification process of the thermo-curable resin 36 is caused to be small, so that it is possible reduce a change in a gap between the light blocking substrate 40 and the sensor substrate 10 (warp of substrate).

(3) Furthermore, the base 31 is formed before a process of forming a predetermined gap at the light blocking substrate 40 and the sensor substrate 10, so that the volume contraction occurring in a process of forming the base 31 may avoid influencing a gap between the light blocking substrate 40 and the sensor substrate 10.

(4) A process of superimposing the light blocking substrate 40 and the sensor substrate 10 is performed using the depressurized atmosphere, so that it is possible to inhibit an air bubble from being mixed into the thermo-curable resin 36 (light transmitting resin 35).

(5) Furthermore, the thermo-curable resin 36 is filled, and an enclosed space formed by the light blocking substrate 40, the sensor substrate 10, and the sealing material 20 is a negative pressure. If the external atmosphere is changed from the depressurized atmosphere to the atmospheric pressure, in the enclosed space, a large force uniformly acts based on a pressure difference between the negative pressure and the atmospheric pressure, and thereby it is possible to dispose the light blocking substrate 40 and the sensor substrate 10 at a predetermined gap.

(6) Refractive index of the light transmitting resin 35, refractive index of the base 31, an refractive index of the light blocking substrate main body 41 are substantially equal to each other. Accordingly, in the boundary (interface) between the light blocking substrate main body 41 and the light transmitting resin 35, and the boundary between the light transmitting resin 35 and the base 31, it is possible to inhibit interfacial reflection based on the difference in a refractive index.

(7) A coating amount of the thermo-curable resin 36 is set to be smaller than a space surrounded by the sensor substrate 10, the light blocking substrate 40, the base 31, and the sealing material 20, so that it is possible to inhibit the thermo-curable resin 36 from protruding from the space, that is, the sealing material 20.

In addition, the void 39 is formed between the sealing material 20 and the base 31, so that it is possible to store the thermo-curable resin 36 in the void 39 not to protrude from the sealing material 20. Furthermore, using the void 39, it is possible to ease the influence of volume contraction occurring in the solidification process of the thermo-curable resin 36.

In order to make the sensing region 5 smaller and denser, it is necessary to further reduce an array pitch of the photodiode 13. Specifically, the array pitch of the photodiode 13 of the present embodiment is approximately 100 µm, but in order to make the sensing region 5 much smaller and denser, it is preferable to reduce the array pitch of the photodiode 13 to approximately 50 µm. In this case, it is preferable to dispose the light blocking substrate 40 and the sensor substrate 10 at a gap of approximately 50 µm or more. According to coating of a manufacturing method of the present embodiment, it is possible to dispose the light blocking substrate 40 and the sensor substrate 10 at a uniform gap of approximately 50 µm or more.

In addition, even in a case where the light blocking substrate 40 and the sensor substrate 10 are disposed at a gap described in the present embodiment or more (gap of approximately 100 µm or more), by applying the manufacturing method of the present embodiment, it is possible to dispose the light blocking substrate 40 and the sensor substrate 10 at a uniform gap.

Furthermore, in addition to the above-mentioned imaging device 1, the manufacturing method of the present embodiment may be applied to a manufacturing method of an electronic device having a pair of substrates formed at a predetermined gap, for example, a manufacturing method of attaching a touch panel to an electro-optical device such as a liquid crystal display device and the like, or a manufacturing method of attaching a dust-proof glass to the electro-optical device as a light bulb in a use of a projector.

Embodiment 2

Figure 5:
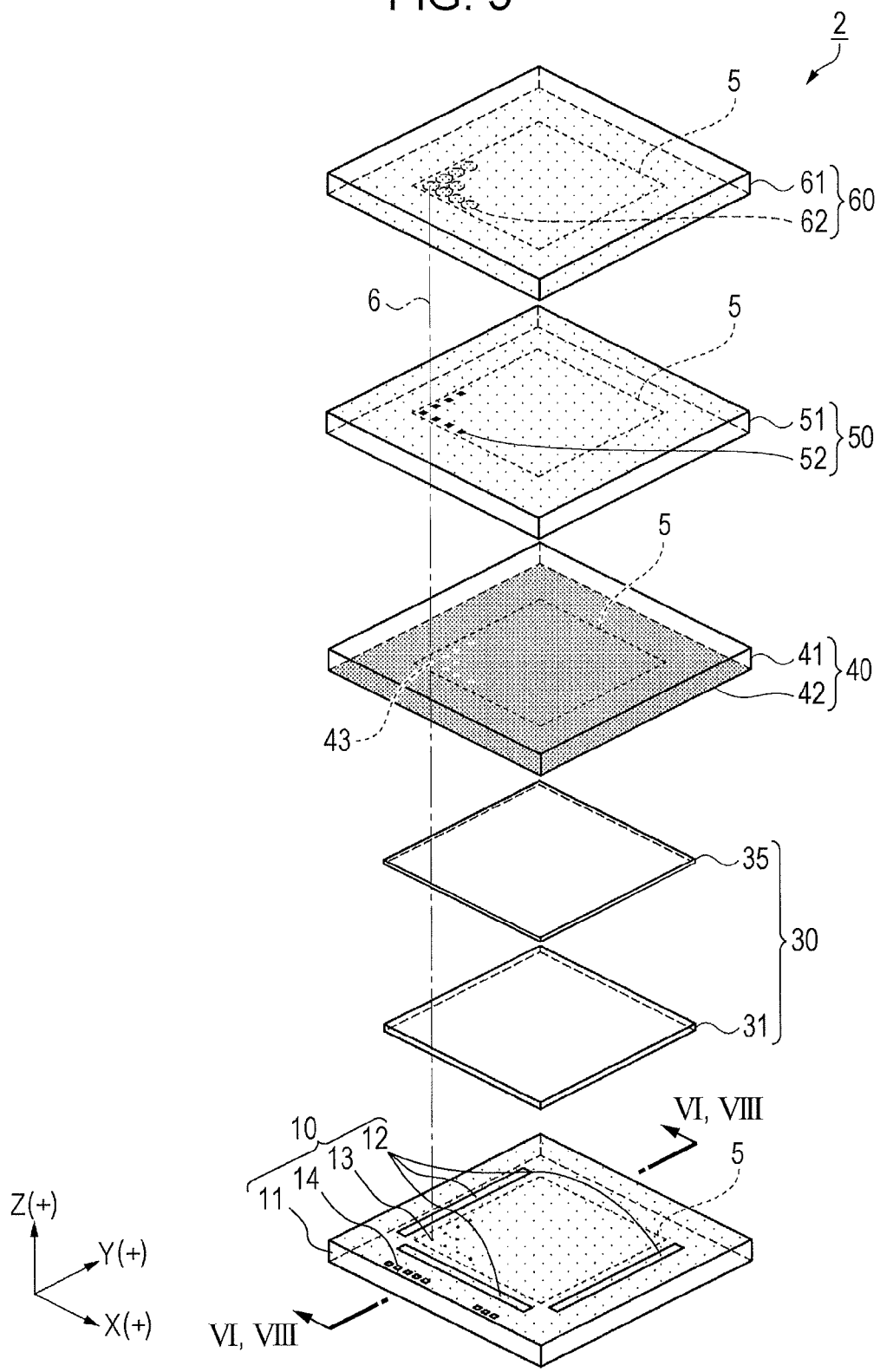
FIG. 5 is an exploded perspective view illustrating a configuration of the imaging device according to a second embodiment.
Figure 6:
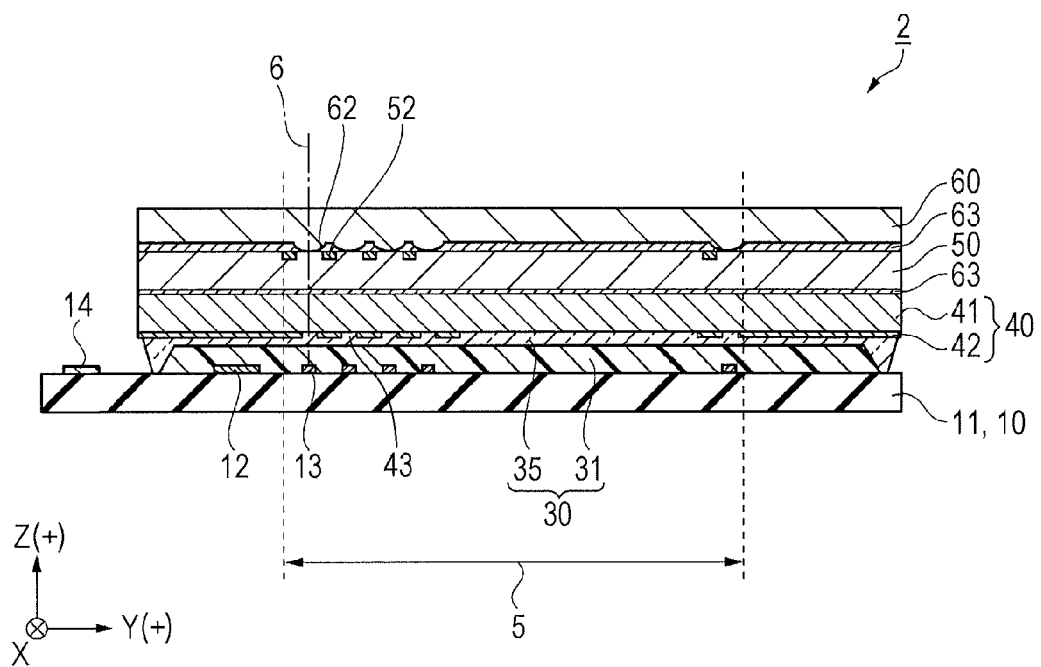
FIG. 6 is a cross-sectional view taken along a line VI-VI of FIG. 5.

FIG. 5 is an exploded perspective view showing a configuration of an imaging device 2 according to an embodiment 2, and corresponds to FIG. 1. FIG. 6 is a cross-sectional view taken along a line of VI-VI of FIG. 5, and corresponds to FIG. 2. Hereinafter, referring to FIGS. 5 and 6, the imaging device 2 according to the present embodiment will be described mainly on the difference from the embodiment 1. In addition, with regard to a configuration part the same as the embodiment 1, the same reference numeral is given to omit a duplicated description.

Outline of Imaging Device

In the imaging device 1 according to the embodiment 1, in order to dispose the sensor substrate 10 and the light blocking substrate 40 at a predetermined gap, the sealing material 20 and the light transmitting member 30 (the base 31, the light transmitting resin 35) are disposed between the sensor substrate 10 and the light blocking substrate 40 (refer to FIGS. 1 and 2).

As illustrated in FIGS. 5 and 6, in an imaging device 2 according to the present embodiment, the light transmitting member 30 (the base 31, the light transmitting resin 35) is disposed between the sensor substrate 10 and the light blocking substrate 40, and the sealing material 20 in the embodiment 1 is not disposed, which is different from the embodiment 1.

Furthermore, the thickness of composition materials of the light transmitting member 30 (the length of Z axis direction), that is, the thickness of the base 31 and the thickness of the light transmitting resin 35, is different from in the embodiment 1. In the imaging device 1 according to the embodiment 1, the thickness of the base 31 is approximately 70 µm, and the thickness of the light transmitting resin 35 is approximately 30 µm. In the imaging device 2 according to the present embodiment, the thickness of the base 31 is approximately 90 µm, and the thickness of the light transmitting resin 35 is approximately 10 µm. That is, compared to the embodiment 1, the thickness (volume) of the base 31 is larger, and the thickness (volume) of the light transmitting resin 35 becomes smaller.

Figure 7:
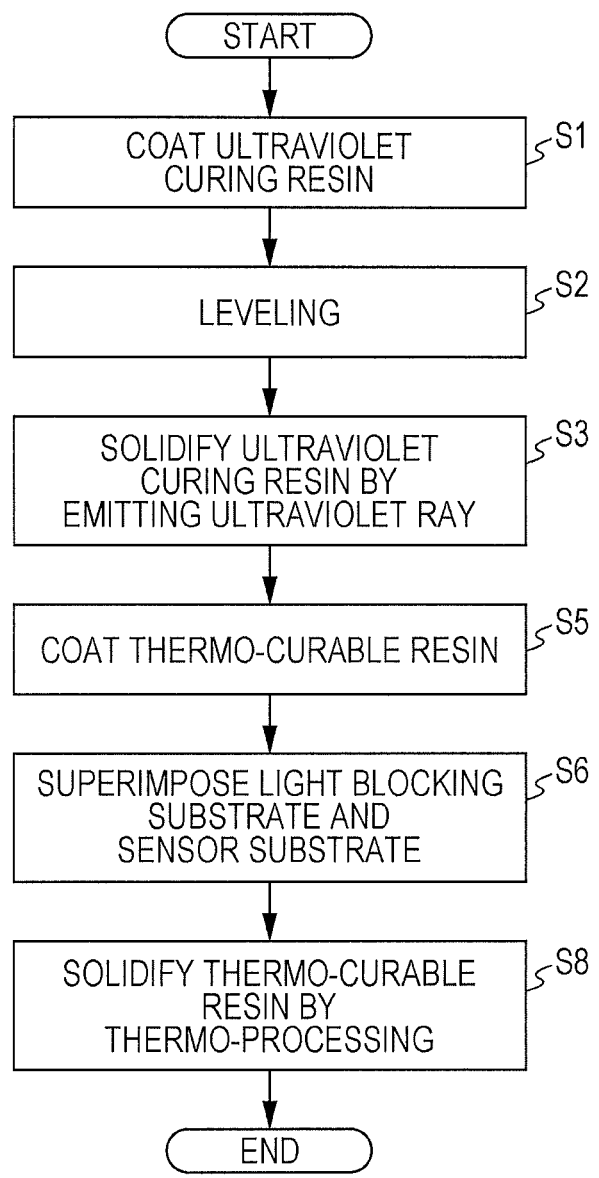
FIG. 7 is a flowchart illustrating a method of manufacturing the imaging device according to the second embodiment in the process order.
Figure 8:
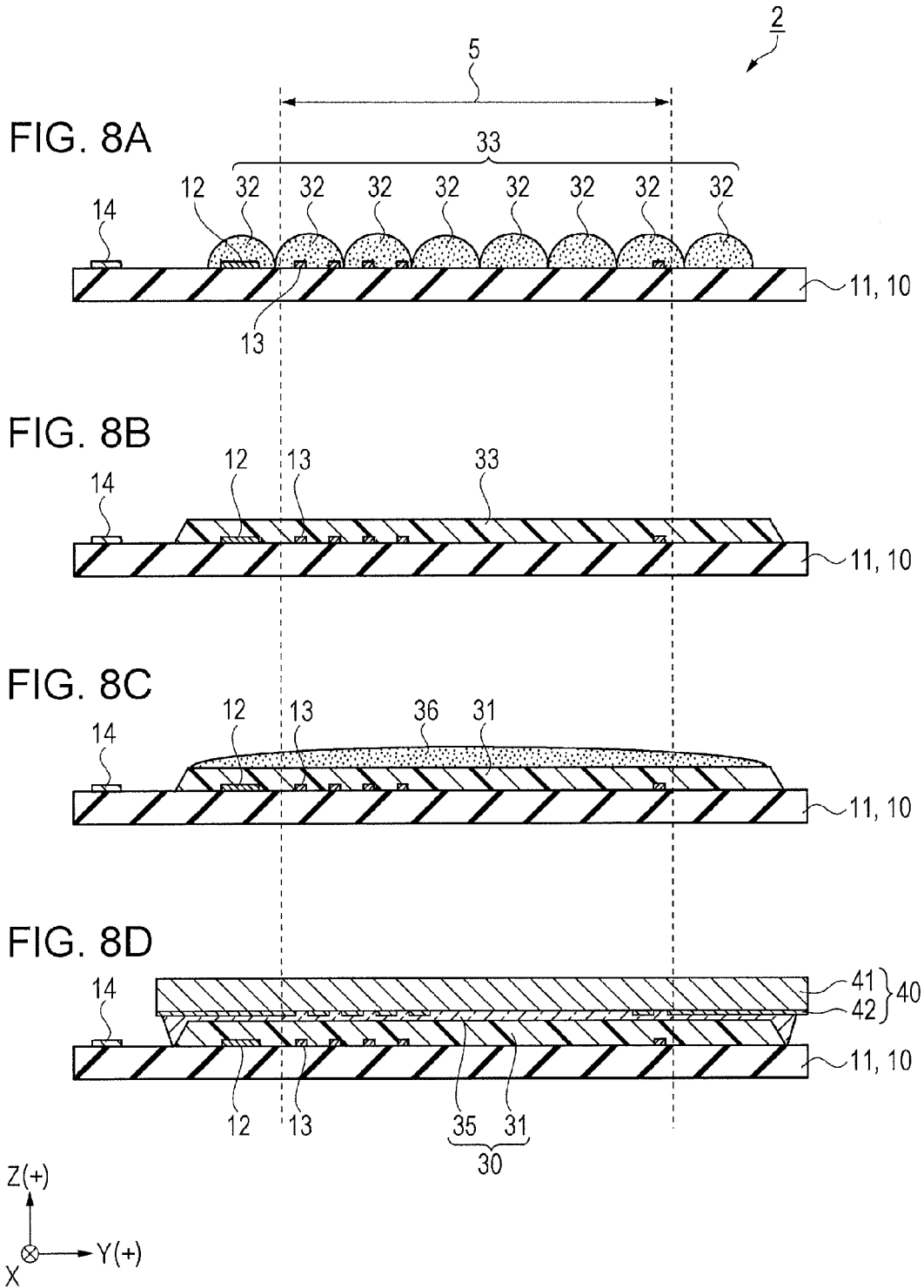
FIGS. 8A to 8D are cross-sectional views of a main process taken along a line VIII-VIII of FIG. 5.

Outline of Manufacturing Method of Disposing Light Blocking Substrate and Sensor Substrate at a Uniform Gap FIG. 7 is a flowchart illustrating a manufacturing method of disposing the light blocking substrate and the sensor substrate at a uniform gap in a process order, and corresponds to FIG. 3. FIGS. 8A to 8D are cross-sectional views of a main process taken along a line of VIII-VIII of FIG. 5, and correspond to FIGS. 4A to 4E.

In the present embodiment, a process of forming the sealing material 20, that is, a process of step S4 and a process of step S7 (refer to FIG. 3) according to the embodiment 1, is omitted. Hereinafter, an outline of the process of manufacturing the imaging device 2 according to the present embodiment will be described referring to FIGS. 7 and 8.

In the process of step S1 (FIG. 7), the sensor substrate 10 is coated with the first UV curable resin 32 using a dispenser to form the base precursor 33.

FIG. 8A illustrates a state immediately after coating the first UV curable resin 32. As illustrated in FIG. 8A, in immediately after coating of the first UV curable resin 32, a plurality of the first UV curable resin 32 in a line shape coated and formed along the X axis direction is disposed in the Y axis direction, and the base precursor 33 is formed. The surface of the base precursor 33 (the surface on the Z axis (+) direction side) has concave and convex portions, and the thickness (the length of the Z axis direction) is periodically changed.

In the process of step S2 (FIG. 7), the coated first UV curable resin 32 is disposed for a predetermined time and is allowed to flow to perform leveling which makes the thickness of the base precursor 33 uniform.

FIG. 8B is a view illustrating a state of the base precursor 33 after the leveling. As illustrated in FIG. 8B the first UV curable resin 32 flows so that the surface area may be minimized by the surface tension and the weight of the first UV curable resin 32. As a result, the base precursor 33 has a flat surface and a uniform thickness. The thickness of the base precursor 33 is approximately 95 µm, and the base precursor 33 is contracted in volume in a process of solidifying the first UV curable resin 32 to be described below to be the base 31 with the thickness of approximately 90 µm. In addition, by adjusting a coating amount of the first UV curable resin 32, it is possible to adjust the thickness of the base precursor 33.

In the process of step S3 (FIG. 7), the UV light is emitted and the first UV curable resin 32 is cured (solidified) to form the base 31. As described above, since the first UV curable resin 32 is contracted in volume in the solidification process, the base precursor 33 with the thickness of approximately 95 µm becomes the base 31 with the thickness of approximately 90 µm.

In the process of step S5 (FIG. 7), using the dispenser, the surface of the base 31 is coated with the thermo-curable resin 36. The viscosity of the thermo-curable resin 36 is approximately 300 cP.

FIG. 8C is a view illustrating a state after coating the thermo-curable resin 36. As illustrated in FIG. 8C, the thermo-curable resin 36 has a low viscosity (approximately 300 cP), so that the thermo-curable resin 36 coated on the base 31 is spread over by the surface tension and the weight of the thermo-curable resin 36 to cover the surface of the base 31.

In the process of step S6 (FIG. 7), the light blocking substrate 40 is superimposed on a predetermined position of the sensor substrate 10 (bonded), and is pressed so that a gap between the light blocking substrate 40 and the sensor substrate 10 (the thickness of the thermo-curable resin 36) may be approximately 11 µm. These processes are performed using the depressurized atmosphere. If the light blocking substrate 40 and the sensor substrate 10 are pressed, the thermo-curable resin 36 protrudes from between the light blocking substrate 40 and the base 31. If the thermo-curable resin 36, which protrudes from between the light blocking substrate 40 and the base 31, reaches a terminal 14, it is difficult to be electrically connected to an external circuit (not illustrated). Therefore, it is necessary to adjust the coating amount of the thermo-curable resin 36 to the extent that the thermo-curable resin 36 does not protrude to the terminal 14 in the process of step S5.

By performing the process of step S6 using the depressurized atmosphere, it is possible to inhibit an air bubble from being mixed into the thermo-curable resin 36. In addition, when using the thermo-curable resin 36 which is sufficiently de-foamed, the process of step S6 may be performed at the atmospheric pressure.

In the process of step S8 (FIG. 7), the heat treatment is performed and the thermo-curable resin 36 is cured (solidified) to form the light transmitting resin 35 between the base 31 and the light blocking substrate 40. As described above, the thermo-curable resin 36 is contracted in volume in the solidification process, so that the thermo-curable resin 36 with the thickness of approximately 11 µm may be the light transmitting resin 35 with the thickness of approximately 10 µm.

FIG. 8D is a view illustrating a state after performing the process of step S8. The light transmitting resin 35 is formed so as to cover the base 31 between the light blocking substrate 40 and the base 31. The thickness of the light transmitting member 30 is approximately 100 µm. The gap between the light blocking substrate 40 and the sensor substrate 10 (approximately 100 µm) is formed by the base 31 with the thickness of approximately 90 µm and the light transmitting resin 35 with the thickness of approximately 10 µm.

In the present embodiment, most of the gap between the light blocking substrate 40 and the sensor substrate 10 is formed by the base 31. Specifically, the thickness of the base 31 is set to be 90% of the gap between the light blocking substrate 40 and the sensor substrate 10. Accordingly, in order to dispose the light blocking substrate 40 and the sensor substrate 10 at a predetermined gap, the base 31 functions an important role.

Accordingly, in the present embodiment, it is important to form the base precursor 33 for forming the base 31 at a uniform thickness. In order to form the base precursor 33 at a uniform thickness on the sensor substrate 10, in the process of step S1 and the process of step S2, it is important to maintain the sensor substrate 10 in a horizontal state, and to coat the first UV curable resin 32 on the sensor substrate 10 to flow (perform leveling). If the sensor substrate 10 is obliquely inclined, the first UV curable resin 32 obliquely flows. Accordingly, the thickness of the base precursor 33 is not uniform. A horizontal surface of the sensor substrate 10 is coated with the first UV curable resin 32, and the base 31 (base precursor 33) has a uniform thickness by performing leveling.

The share of the light transmitting resin 35 in the gap between the light blocking substrate 40 and the sensor substrate 10 is less than approximately 10% and becomes smaller than in the embodiment 1, and thereby it is possible to reduce the influence caused by a change in thickness of the light transmitting resin 35. Specifically, it is possible to reduce volume contraction occurring in a process of forming the light transmitting resin 35 by solidifying the thermo-curable resin 36. In addition, in the process of step S6, the thermo-curable resin 36 filling in a space between the surface of the base 31 and the light blocking substrate 40 is pressed to be a predetermined thickness. The pressing may be a technical pressing or a pressing by the weight of the light blocking substrate 40. The filling amount of the thermo-curable resin 36 is small, so that a change in the thickness of the thermo-curable resin 36 using the pressing process is acceptable.

Thus, in the present embodiment, 90% or more in the gap between the light blocking substrate 40 and the sensor substrate 10 is occupied by the base 31, the base 31 is formed at a uniform thickness, and thereby a change (variation) in the gap between the light blocking substrate 40 and the sensor substrate 10 is inhibited at 10% or less (±5% or less). Accordingly, it is possible to dispose the light blocking substrate 40 and the sensor substrate 10 at a predetermined gap. That is, the base 31 is thicker than in the embodiment 1, so that, even without forming the sealing material 20 which is in the embodiment 1, it is possible to dispose the light blocking substrate 40 and the sensor substrate 10 at a predetermined gap.

As described above, according to the imaging device 2 related to the present embodiment, in addition to effects (1), (3), (4), and (6) in the embodiment 1, it is possible to obtain the following effects.

(8) When leveling is performed on a horizontal surface by maintaining the sensor substrate 10 in a horizontal state and coating the first UV curable resin 32 on the horizontal surface of the sensor substrate 10, the base precursor 33 with a uniform thickness is formed using the surface tension and the weight of the first UV curable resin 32. The base precursor 33 is solidified by emitting UV light thereto, so that it is possible to form the base 31 having a uniform thickness. At this time, volume contraction occurs in the base 31, but in a previous process superimposing the sensor substrate 10 and the light blocking substrate 40, and thereby not influencing on the gap between the sensor substrate 10 and the light blocking substrate 40.

(9) Furthermore, the base 31 is configured to occupy 90% or more of the light transmitting member 30, and the light transmitting resin 35 is configured to occupy less than 10% of the light transmitting member 30. Accordingly, the base 31 is thickly formed compared to in the embodiment 1 and the base 31 is formed at a uniform thickness using the above-mentioned method, and thereby it is possible to dispose the light blocking substrate 40 and the sensor substrate 10 at a predetermined gap (approximately 100 µm) even without forming the sealing material 20 which is in the embodiment 1. Accordingly, it is possible to provide the imaging device 2 at a lower cost than in the embodiment 1.

The light transmitting resin 35 may be formed not using the thermo-curable resin 36, but using a resin having properties of both UV curability and thermo-curability. By coating the UV curability, it is possible to rapidly cure the light transmitting resin 35.

A manufacturing method of the present embodiment may be applied to a manufacturing method of an electronic device having a pair of substrates formed at a predetermined interval the same as in the first embodiment, for example, a manufacturing method of attaching a touch panel on an electro-optical apparatus such as a liquid crystal display device and a manufacturing method of attaching a dust-proof glass on the electro-optical apparatus as a light bulb in the projector use.

The present invention is not limited to the above-mentioned embodiment, and it is possible to add various changes and modifications to the above-mentioned embodiment. The modification example will be described below.

Modification Example 1

In the imaging device 1 of the embodiment 1, the light transmitting resin 35 is filled between the base 31 and the light blocking film 42 (refer to FIG. 2). In addition, the light transmitting resin 35 is formed by performing a heat treatment on the thermo-curable resin 36, and is a transparent solid.

In the imaging device of the present modification example, the light transmitting material filled between the base 31 and the light blocking film 42, that is, a material equivalent to the light transmitting resin 35 in the embodiment 1 may be a transparent material having fluidity.

An example of the transparent material having fluidity which is filled between the base 31 and the light blocking film 42 are preferably, for example, an organic metal compound such as metal alkoxide, metal carboxylates, metal chelates, and the like. A specific example of the organic metal compound is aluminum-based metal complexes (Futaba electronic industry (Co.) make, Ole dry) and the like. Such metal complexes have hygroscopic property in addition to light-transmitting property, so that, for example, it is possible to exclude the influence of water on the photodiode 13 disposed in the sensing region 5.

Other suitable examples of the transparent material having fluidity may be high viscous liquid such as fluidity paraffin, silicone oil, and modified silicone oil. In a case where air bubbles are present in the transparent liquid, it is possible to inhibit the movement of the air bubbles having a high viscosity.

As described above, according to the imaging device related to the present embodiment, it is possible to obtain the following effects in addition to the effects in the embodiment 1.

In the present embodiment, the light transmitting material filled between the base 31 and the light blocking film 42 does not have a volume change equivalent to the volume contraction during curing of the thermo-curable resin 36 in the embodiment 1, so that it is possible to form the gap between the light blocking substrate 40 and the sensor substrate 10 with higher accuracy.

Inspection Apparatus

Outline of Inspection Apparatus

Next, an example of an inspection apparatus equipped with the imaging device of any one of the above-described embodiment 1, embodiment 2, and modification example 1 will be described.

Figure 9:
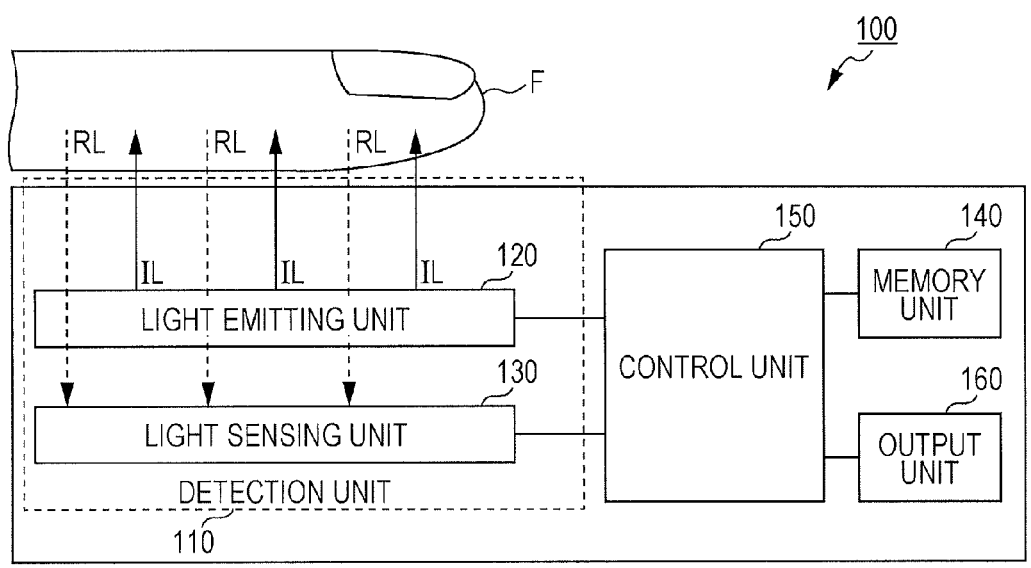
FIG. 9 is a schematic view illustrating a configuration of an inspection apparatus.

FIG. 9 is a schematic view illustrating a configuration of the inspection apparatus.

The inspection apparatus 100 is a biometric authentication device which performs personal authentication by capturing the vein image of a finger F. As shown in FIG. 9, the inspection apparatus 100 includes a detection unit 110, a memory unit 140, a control unit 150, an output unit 160, and the like.

The detection unit 110 is an imaging device 1 according to the embodiment 1, and emits emitting light IL from a light emitting unit 120 to the finger F to detect reflected light RL from the finger F. In addition to the imaging device 1 according to the embodiment 1, it is possible to use any one of the imaging device 2 of the embodiment 2 and the imaging device of the modification example 1.

The detection unit 110 includes the light-emitting unit 120 (illumination substrate 50, refer to FIG. 1), the MLA substrate 60 (not illustrated), the light blocking substrate 40 (not illustrated), the light sensing unit 130 (sensor substrate 10, refer to FIG. 1), and the like. The emitting light IL is light in a near infrared region emitted from the light emitting unit 120, and the wavelength is, for example, 750 to 3000 nm (more preferably 800 to 900 nm). The emitting light IL is scattered when reaching inside the finger F, so that a portion thereof is toward the light sensing unit 130 as the reflected light RL.

In the light sensing unit 130, the photodiode 13 detecting light in the near infrared region is disposed. The reduced hemoglobin flowing veins has a property of absorbing light in the near infrared region. Therefore, when the finger F is captured using the photodiode 13 detecting the light in the near infrared region, a venous portion under the skin of the finger F appears dark compared to the surrounding tissues. Patterns provided by a difference of the brightness are the vein image. The reflected light RL from the finger F is converted to an electrical signal (light sensing signal) having a signal level corresponding to the amount of light by the light sensing unit 130.

The memory unit 140 is a non-volatile memory such as a flash memory, a hard disk, or the like. As a master vein image of the personal authentication, the vein image of the finger F (for example, right index finger) which is registered in advance is memorized.

The control unit 150 includes a Central Processing Unit (CPU), a Random Access Memory (RAM), and the like, and controls ON and OFF of the light emitting unit 120. In addition, the control unit 150 reads a light sensing signal from the light sensing unit 130, and generates a vein image of the finger F based on the read light sensing signal of one frame portion (imaging region portion). Furthermore, the control unit 150 combines the generated vein image with the master vein image registered in the memory unit 140 to perform the personal authentication.

The output unit 160 is, for example, a display unit or a voice notification unit, and notifies a authentication result by a display or voice.

By the above-mentioned configuration, the inspection apparatus 100 may capture the vein image of the finger F with a high accuracy to perform the personal authentication.

In addition, a part of the living subject which is an object of the vein authentication may be a palm, the back of the hand, an eye, or the like.

The detection unit 110 described above may be applied to a small biosensor which may be always installed in a medical and health fields. Furthermore, as the inspection apparatus equipped with the detection unit 110, in the medical and health fields, it is possible to provide, for example, pulse rate monitor, a pulse oximeter, blood glucose meter, or fruit sugar content meter. Furthermore, using the detection unit 110, it is possible to provide a personal computer or a mobile phone having a biometric authentication function.

In addition, the detection unit 110 may be applied to an image reading device like an image scanner, a copier, a facsimile, a bar code reader, and the like. In addition, in a case of coating the detection unit to the image reading apparatus, it is preferable to use light in a visible region instead of light in the near infrared region as the emitting light IL or the reflected light RL.

The entire disclosure of Japan Patent Application No. 2012-191445, filed Aug. 31, 2012 is expressly incorporated by reference herein.

What is claimed is:

1. A method of manufacturing an electronic device having a pair of substrates disposed to be opposite to each other at a predetermined gap, the method comprising:
    forming a base on one substrate of the pair of substrates;
    coating the periphery of the base with an adhesive including a gap material forming the predetermined gap;
    coating the surface of the base with a light transmitting resin material;
    disposing the pair of substrates at a predetermined gap by bringing the other substrate of the pair of substrates in contact with the light transmitting resin material to be superposed on the one substrate; and
    solidifying the adhesive;
    wherein a volume of the light-transmitting resin material coated in the coating of the light-transmitting resin material, when the pair of substrates are superposed each other at the predetermined gap, is smaller than the volume of a space surrounded by the pair of substrates, the base, and the adhesive, and
    wherein the disposing of the pair of substrates at the predetermined gap is performed using a depressurized atmosphere.

2. The method of manufacturing an electronic device according to claim 1,
    wherein the adhesive is a photo-curable resin, and the light-transmitting resin material is thermo-curable resin.

3. The method of manufacturing an electronic device according to claim 2,
    wherein the predetermined gap is 50 μm or more,
    wherein, in a total volume which is a sum of the volume of the base and the volume of the light-transmitting resin material which are disposed between the pair of substrates, the base is formed so as to have a 50% or more volume occupancy.

4. The method of manufacturing an electronic device according to claim 3, wherein the base is formed using photo-curable resin.

* * * * *